US012575457B2

(12) United States Patent
Gao et al.

(10) Patent No.: US 12,575,457 B2
(45) Date of Patent: Mar. 10, 2026

(54) CHIP STACKING STRUCTURE AND PREPARATION METHOD THEREOF, CHIP STACKING PACKAGE, AND ELECTRONIC DEVICE

(71) Applicant: HUAWEI TECHNOLOGIES CO., LTD., Shenzhen (CN)

(72) Inventors: Shan Gao, Shenzhen (CN); Jifeng Zhu, Shanghai (CN); Dian Lei, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 364 days.

(21) Appl. No.: 18/358,102

(22) Filed: Jul. 25, 2023

(65) Prior Publication Data

US 2023/0369292 A1      Nov. 16, 2023

Related U.S. Application Data

(63) Continuation of application No. PCT/CN2021/073836, filed on Jan. 26, 2021.

(51) Int. Cl.
*H01L 25/065* (2023.01)
*H01L 23/00* (2006.01)
*H01L 25/00* (2006.01)

(52) U.S. Cl.
CPC .......... *H01L 25/0657* (2013.01); *H01L 24/05* (2013.01); *H01L 24/08* (2013.01); *H01L 24/24* (2013.01); *H01L 24/82* (2013.01); *H01L 25/50* (2013.01); *H01L 25/0652* (2013.01); *H01L 2224/05687* (2013.01); *H01L 2224/08145* (2013.01); *H01L 2224/24146* (2013.01); *H01L*

*2224/80896* (2013.01); *H01L 2224/80986* (2013.01); *H01L 2224/82897* (2013.01); *H01L 2224/82986* (2013.01); *H01L 2225/06517* (2013.01); *H01L 2225/06524* (2013.01);
(Continued)

(58) Field of Classification Search
CPC ............ H01L 25/0657; H01L 25/0652; H01L 2225/06541; H01L 21/76898; H01L 2225/06544; H01L 2224/08145; H01L 24/82; H01L 24/24; H01L 21/768
USPC ........................................................ 257/777
See application file for complete search history.

(56) References Cited

U.S. PATENT DOCUMENTS

2012/0193785 A1* 8/2012 Lin ................... H01L 21/76229
257/737
2016/0020170 A1* 1/2016 Ho .......................... H01L 24/04
257/774
(Continued)

*Primary Examiner* — Didarul A Mazumder

(57) ABSTRACT

A chip stacking structure includes: a first chip, a second chip stacked with the first chip, a first redistribution layer, a second redistribution layer, a third redistribution layer, a first conductive channel, and a second conductive channel; the first redistribution layer is disposed on a surface of the first chip facing the second chip; the second redistribution layer is disposed on a passive surface of the second chip, and the third redistribution layer is disposed on an active surface of the second chip; the first conductive channel passes through the second chip and the third redistribution layer, connecting the first redistribution layer and the second redistribution layer; and the second conductive channel passes through the second chip, connecting the second redistribution layer and the third redistribution layer.

20 Claims, 11 Drawing Sheets

(52) U.S. Cl.
CPC ............... *H01L 2225/06544* (2013.01); *H01L*
*2924/3511* (2013.01)

(56) References Cited

U.S. PATENT DOCUMENTS

| | | | |
|---|---|---|---|
| 2016/0155724 A1* | 6/2016 | Kim .................... | H01L 21/6835 |
| | | | 257/774 |
| 2018/0068958 A1* | 3/2018 | Cho .................... | H01L 25/0657 |
| 2020/0135684 A1* | 4/2020 | Kim .................... | H01L 25/0655 |
| 2020/0403006 A1* | 12/2020 | Delacruz ............ | H01L 25/0657 |
| 2021/0407941 A1* | 12/2021 | Haba ....................... | H01L 24/08 |

* cited by examiner

02

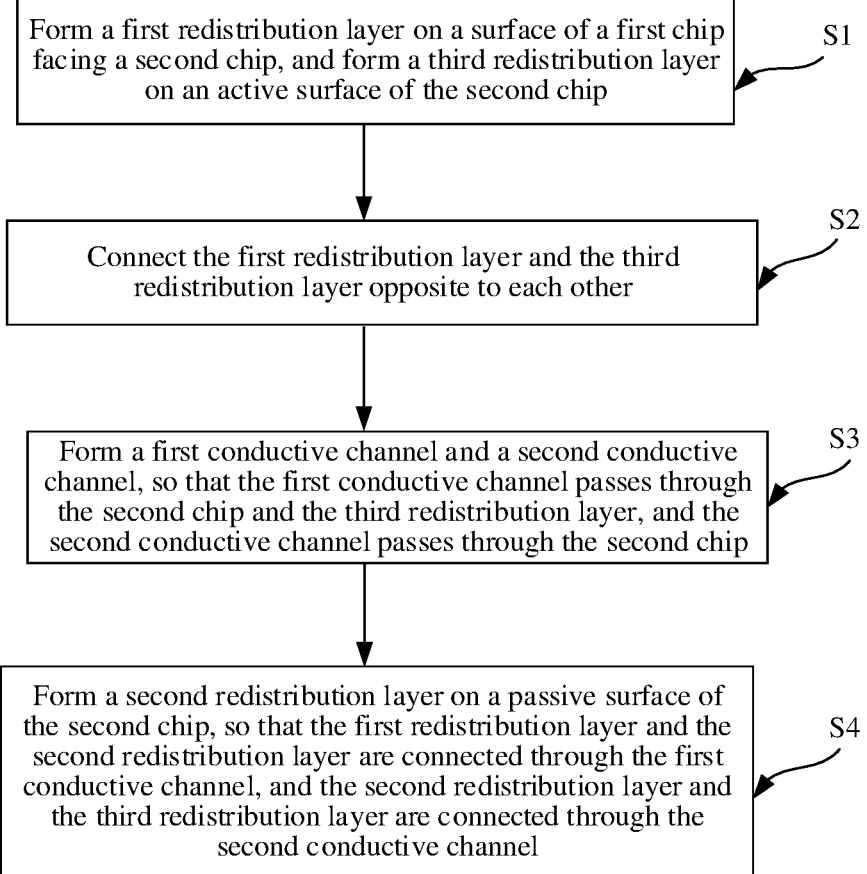

Form a first redistribution layer on a surface of a first chip facing a second chip, and form a third redistribution layer on an active surface of the second chip — S1

Connect the first redistribution layer and the third redistribution layer opposite to each other — S2

Form a first conductive channel and a second conductive channel, so that the first conductive channel passes through the second chip and the third redistribution layer, and the second conductive channel passes through the second chip — S3

Form a second redistribution layer on a passive surface of the second chip, so that the first redistribution layer and the second redistribution layer are connected through the first conductive channel, and the second redistribution layer and the third redistribution layer are connected through the second conductive channel — S4

CHIP STACKING STRUCTURE AND PREPARATION METHOD THEREOF, CHIP STACKING PACKAGE, AND ELECTRONIC DEVICE

CROSS-REFERENCE TO RELATED APPLICATIONS

This application is a continuation of International Application No. PCT/CN2021/073836, filed on Jan. 26, 2021, the disclosure of which is hereby incorporated by reference in its entirety.

TECHNICAL FIELD

This disclosure relates to the field of semiconductor technologies, and in particular, to a chip stacking structure and a preparation method thereof, a chip stacking package, and an electronic device.

BACKGROUND

As demands of high-speed data communication and artificial intelligence for computing power surges, chip integration is further improved. Three-dimensional integrated circuit (IC) technologies are widely used.

FIG. 1 shows a chip stacking package using a 3D stacking integration technology. The chip stacking package includes: a package substrate 1, a first chip 21 and a second chip 22 that are integrated on the package substrate 1 and stacked. An active surface F of the second chip 22 is opposite to a passive surface B of the first chip 21, and an active layer 11 of the first chip 21 is electrically conductive to an active layer 11 of the second chip 22 through a micro bump (μBump) 3 and a through silicon via (TSV) 4. The first chip 21 and the second chip 22 that are stacked are connected to the package substrate 1 through a controlled collapse chip connection (C4 for short) solder joint 5.

That is, in a structure shown in FIG. 1, the μBump 3 and the TSV 4 cooperate to form a path for signal transmission between chips. In this way, as a data communication capacity of each chip continuously increases, a bandwidth supported by the chip stacking structure cannot meet a requirement.

SUMMARY

Embodiments of this disclosure provide a chip stacking structure and a preparation method thereof, a chip stacking package, and an electronic device, with a main objective to provide a chip stacking structure that can support a larger bandwidth.

To achieve the foregoing objective, embodiments of this disclosure use the following technical solutions.

According to a first aspect, this disclosure provides a chip stacking structure, where the chip stacking structure includes: a first chip, a second chip stacked with the first chip, a first redistribution layer, a second redistribution layer, a third redistribution layer, a first conductive channel, and a second conductive channel; an active surface of the second chip faces an active surface of the first chip, or an active surface of the second chip faces a passive surface of the first chip; the first redistribution layer is disposed on a surface of the first chip facing the second chip; the second redistribution layer is disposed on a passive surface of the second chip, and the third redistribution layer is disposed on the active surface of the second chip; the first conductive channel passes through the second chip and the third redistribution layer, connecting the first redistribution layer and the second redistribution layer; and the second conductive channel passes through the second chip, connecting the second redistribution layer and the third redistribution layer.

Based on the chip stacking structure provided in this embodiment of this disclosure, regardless of whether the active surface of the second chip faces the active surface of the first chip or the active surface of the second chip faces the passive surface of the first chip, the first chip and the second chip are electrically conductive through the first redistribution layer on the surface of the first chip facing the second chip, the second redistribution layer on the passive surface of the second chip, and the first conductive channel, thereby implementing signal interconnection between the first chip and the second chip.

In addition, the active surface of the second chip has the third redistribution layer, and the passive surface of the second chip has the second redistribution layer. In addition, the second redistribution layer on the passive surface of the second chip and the third redistribution layer on the active surface of the second chip are connected through the second conductive channel, and signal interworking in the second chip is implemented through the second conductive channel, the second redistribution layer, and the third redistribution layer. In this way, the chip stacking structure not only can implement interconnection between chips, but also can implement interconnection in a chip. Therefore, in comparison with the current technology, a signal transmission path is added, so that a bandwidth is correspondingly increased.

The first chip and the second chip herein may be chip wafers, or may be dies. An existing chip stacking structure is obtained by cutting a chip wafer to obtain chips, stacking the chips, and electrically connecting the chips through a μBump and a TSV. In comparison, in this disclosure, a plurality of chip wafers may be directly stacked and then cut to obtain a plurality of chip stacking structures. In this way, each obtained chip stacking structure does not need to be aligned with two adjacent chips. In addition, each chip obtained through cutting does not need to be cleaned. In this disclosure, only the chip stacking structure obtained through cutting is cleaned, so that a process step can be simplified, a preparation process can be shortened, production efficiency can be improved, and production costs can also be reduced.

In a possible implementation of the first aspect, the chip stacking structure further includes a third chip, a fourth redistribution layer, a fifth redistribution layer, a third conductive channel, and a fourth conductive channel, where the third chip is stacked on the passive surface of the second chip, and an active surface of the third chip faces the passive surface of the second chip; the fourth redistribution layer is disposed on a passive surface of the third chip, and the fifth redistribution layer is disposed on the active surface of the third chip; the third conductive channel passes through the third chip and the fifth redistribution layer, connecting the fourth redistribution layer and the second redistribution layer; and the fourth conductive channel passes through the third chip, connecting the fifth redistribution layer and the fourth redistribution layer.

The third chip is integrated on the passive surface of the second chip, to improve integration of the entire chip stacking structure. In addition, the fourth redistribution layer on the passive surface of the third chip and the second redistribution layer on the passive surface of the second chip are connected through the third conductive channel, to implement signal interconnection between the second chip and the third chip.

In addition, the fourth redistribution layer on the passive surface of the third chip and the fifth redistribution layer on the active surface of the third chip are connected through the fourth conductive channel. Similarly, a transmission path of the chip stacking structure is increased, and a bandwidth is increased.

In a possible implementation of the first aspect, the active surface of the second chip faces the passive surface of the first chip, and the first redistribution layer is disposed on the passive surface of the first chip; and the chip stacking structure further includes a sixth redistribution layer and a fifth conductive channel, where the sixth redistribution layer is disposed on the active surface of the first chip; and the fifth conductive channel passes through the first chip, connecting the sixth redistribution layer and the first redistribution layer.

Similarly, signal interworking in the first chip is implemented through the fifth conductive channel disposed in the first chip.

In a possible implementation of the first aspect, along a stacking direction, a depth of the first conductive channel is greater than a depth of the second conductive channel.

In a possible implementation of the first aspect, a conductive material in the first conductive channel is the same as a conductive material in the second conductive channel.

When the conductive material in the first conductive channel is the same as the conductive material in the second conductive channel, in terms of a preparation process, the preparation process can be simplified, production efficiency can be improved, and production costs can be reduced.

In a possible implementation of the first aspect, the chip stacking structure further includes a dielectric layer, and the dielectric layer is formed between the first redistribution layer and the third redistribution layer.

In a possible implementation of the first aspect, the dielectric layer is used as a bonding layer in a fusion bonding Fusion Bonding process, and is configured to fasten the first chip and the second chip.

In this way, the first chip and the second chip may be fastened opposite to each other through the fusion bonding process between dielectric layers.

In a possible implementation of the first aspect, a material of the dielectric layer includes silicon dioxide.

In a possible implementation of the first aspect, the chip stacking structure includes N chips that are sequentially stacked, where N is a positive integer greater than or equal to 2, the first chip is one of the outermost chips in the N chips, and a micro bump is disposed on an outer side of another outermost chip.

According to a second aspect, this disclosure further provides a preparation method of a chip stacking structure, and the preparation method includes:

forming a first redistribution layer on a surface of a first chip facing a second chip, and forming a third redistribution layer on an active surface of the second chip;

connecting the first redistribution layer and the third redistribution layer opposite to each other;

forming a first conductive channel and a second conductive channel, so that the first conductive channel passes through the second chip and the third redistribution layer, and the second conductive channel passes through the second chip; and forming a second redistribution layer on a passive surface of the second chip, so that the first redistribution layer and the second redistribution layer are connected through the first conductive channel, and the second redistribution layer and the third redistribution layer are connected through the second conductive channel.

In the preparation method of a chip stacking structure provided in this embodiment of this disclosure, not only the first conductive channel is formed, but also the second conductive channel is formed. Signal interworking between the first chip and the second chip is implemented through the first conductive channel and the redistribution layers, and signal interworking in the second chip is implemented through the second conductive channel and the redistribution layers. In this way, in the obtained chip stacking structure, a bandwidth can be increased compared with that of an existing chip stacking structure.

In a possible implementation of the second aspect, when forming the first redistribution layer on the surface of the first chip facing the second chip, the method includes: forming the first redistribution layer on an active surface of the first chip, so that the active surface of the second chip is opposite to the active surface of the first chip; or forming the first redistribution layer on a passive surface of the first chip, so that the active surface of the second chip is opposite to the passive surface of the first chip.

In this way, two chip stacking structures of different structures are formed. In one structure, the active surface of the first chip is opposite to the active surface of the second chip, and in the other structure, the active surface of the first chip is opposite to a passive surface of the second chip.

In a possible implementation of the second aspect, the preparation method further includes: forming a fifth redistribution layer on an active surface of a third chip; and after the forming a second redistribution layer on a passive surface of the second chip, the preparation method further includes: connecting the second redistribution layer and the fifth redistribution layer opposite to each other; forming a third conductive channel and a fourth conductive channel, so that the third conductive channel passes through the third chip and the fifth redistribution layer, and the fourth conductive channel passes through the third chip; and forming a fourth redistribution layer on a passive surface of the third chip, so that the fourth redistribution layer and the second redistribution layer are connected through the third conductive channel, and the fifth redistribution layer and the fourth redistribution layer are connected through the fourth conductive channel.

The method implements stacking of more chips, and improves integration of the chip stacking structure. In addition, signal interworking in the third chip is implemented through the fourth conductive channel and the redistribution layers.

In a possible implementation of the second aspect, the second conductive channel is formed at the same time when the first conductive channel is formed. In this way, a preparation process can be simplified, and manufacturing costs can be reduced.

In a possible implementation of the second aspect, when connecting the first redistribution layer and the third redistribution layer opposite to each other, the method includes: forming a dielectric layer on each of the first redistribution layer and the third redistribution layer, and connecting the first chip and the second chip through fusion bonding between the dielectric layers.

In a possible implementation of the second aspect, before the connecting the first redistribution layer and the third redistribution layer opposite to each other, the method further includes: carrying the first chip on a carrier; and after the second chip is stacked on the first chip, the method further includes: removing the carrier.

When a plurality of chips are stacked in the stacking manner, the active surface of the first chip is placed facing the carrier and is fastened opposite to the carrier, and then the active surface of the second chip is placed facing the passive surface of the first chip, so that the passive surface of the first chip is opposite to the active surface of the second chip after the carrier is removed.

In a possible implementation of the second aspect, the carrier is a wafer or a substrate.

In a possible implementation of the second aspect, after connecting a surface with the first redistribution layer of the first chip and the third redistribution layer of the second chip opposite to each other, and before the forming a second redistribution layer on a passive surface of the second chip, the method further includes: thinning the passive surface of the second chip.

According to a third aspect, this disclosure further provides a chip stacking package, including a package substrate and a chip stacking structure, where the chip stacking structure is disposed on a surface of the package substrate; the chip stacking structure is the chip stacking structure according to any implementation of the first aspect, or a chip stacking structure obtained according to the preparation method of a chip stacking structure according to any implementation of the second aspect, and the second chip is close to the package substrate relative to the first chip.

The chip stacking package provided in this embodiment of this disclosure includes the chip stacking structure in the embodiment of the first aspect or the chip stacking structure obtained in the embodiment of the second aspect. In this way, in comparison with the current technology, a signal transmission path is added, so that a bandwidth is effectively increased. In particular for larger integration and a larger data communication capacity, an effect of increasing the bandwidth is more prominent.

According to a fourth aspect, this disclosure further provides an electronic device, including a printed circuit board and the chip stacking package in the third aspect, where the printed circuit board is electrically connected to the chip stacking package.

The electronic device provided in this embodiment of this disclosure includes the chip stacking package in the third aspect. Therefore, the electronic device provided in the embodiment of this disclosure and the chip stacking package in the foregoing technical solution can resolve a same technical problem, and achieve a same expected effect.

BRIEF DESCRIPTION OF DRAWINGS

FIG. 11 is a schematic flowchart of a preparation method of a chip stacking structure according to an embodiment of this disclosure;

REFERENCE SIGNS

01—printed circuit board; 02—chip stacking package; 03—first electrical connection structure; A-chip stacking structure; 1—package substrate; 2—chip; 21—first chip; 22—second chip; 23—third chip; 24—fourth chip; 25—fifth chip; 2-1—die; 2-2—chip wafer; 11—active layer; 12—substrate; 3—micro bump; 4—through silicon via; 5—C4; 61—first conductive channel; 62—second conductive channel; 63—third conductive channel; 64—fourth conductive channel; 71—first redistribution layer; 72—second redistribution layer; 73—third redistribution layer; 74—fourth redistribution layer; 75—fifth redistribution layer; 76—sixth redistribution layer; 91—dielectric layer; 92—second dielectric layer; 10—CP pad; and 13—carrier.

DESCRIPTION OF EMBODIMENTS

An embodiment of this disclosure provides an electronic device. The electronic device may include a mobile phone, a tablet computer, an intelligent wearable product (for example, a smartwatch or a smart band), a virtual reality (VR) device, or an augmented reality (AR) device, or a device such as a home appliance, or a server, a data center, or the like. A specific form of the electronic device is not specifically limited in this embodiment of this disclosure.

Figures 1, 2, 3:
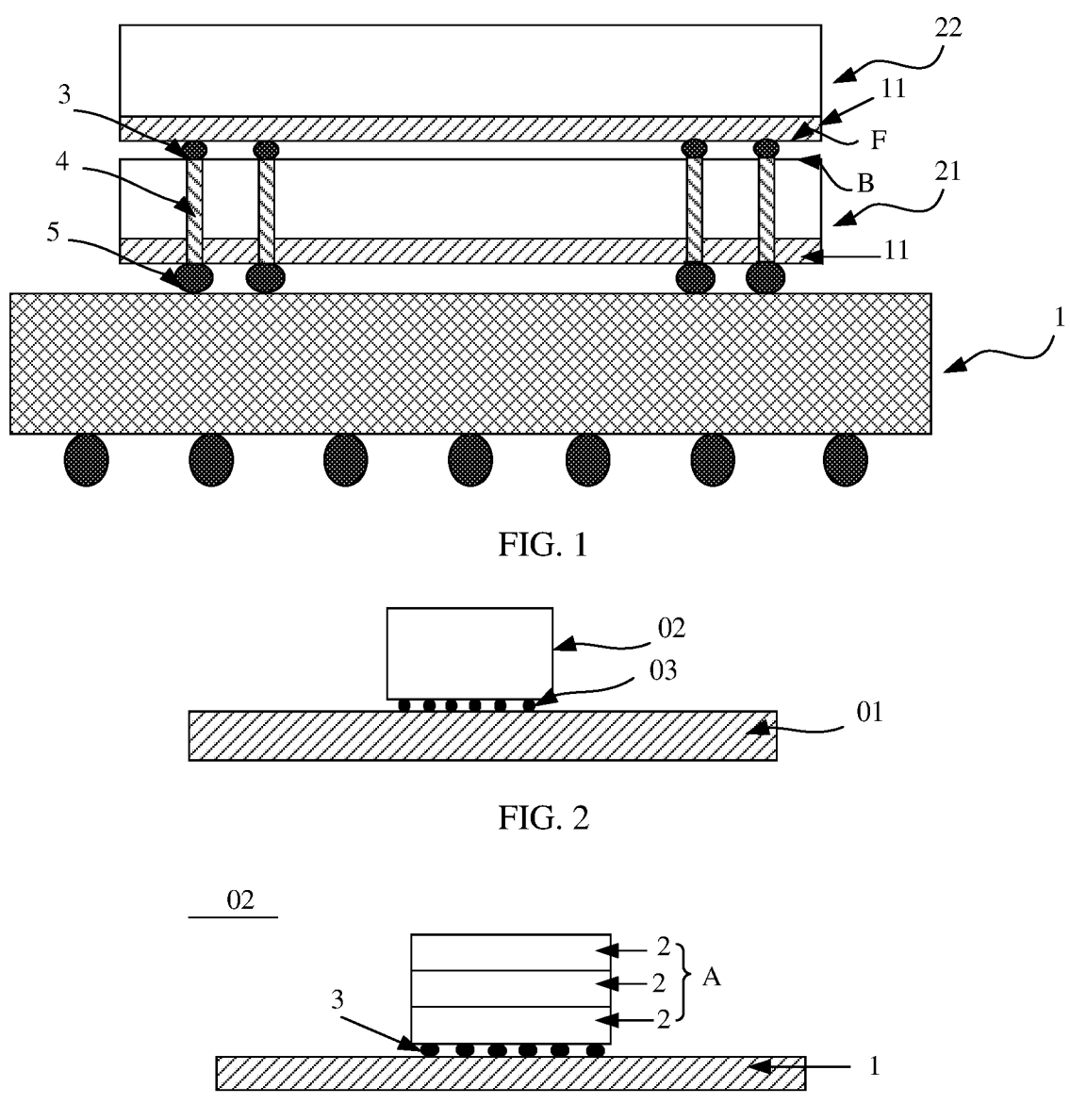
FIG. 1 is a schematic diagram of a structure of a chip stacking package in a current technology.
FIG. 2 is a schematic diagram of a part of a structure of an electronic device according to an embodiment of this disclosure.
FIG. 3 is a schematic diagram of a structure of a chip stacking package according to an embodiment of this disclosure.

As shown in FIG. 2, the electronic device may include a printed circuit board (PCB) 01 and a chip stacking package 02. The chip stacking package 02 is electrically connected to the PCB 01 through a first electrical connection structure 03, so that the chip stacking package 02 can be interconnected with another chip or another module on the PCB 01.

In an optional implementation, the first electrical connection structure 03 may be a ball grid array (BGA).

With an increase of a quantity of cores and speed of a chip, chip integration is continuously improved. For example, in the 5th-generation mobile communication technology (5G), the chip integration is continuously improved, and 3D integration of chips has been widely adopted.

FIG. 3 shows a 3D-integrated chip stacking package. The chip stacking package 02 includes a package substrate 1 and a plurality of stacked chips 2. The plurality of stacked chips 2 form a chip stacking structure A, and the chip stacking structure A is electrically connected to the package substrate 1 through a second electrical connection structure. The second electrical connection structure herein may be a µBump 3, or may be a controlled collapse chip connection (C4 for short) solder joint.

It should be noted that the chips 2 in this embodiment of this disclosure may be dies (also referred to as particles or bare chips), or may be chip wafers. It may be understood that, after an epitaxial layer is grown on a wafer, the chip wafer is formed, and the chip wafer is cut to obtain the bare chip (die).

Figure 4:
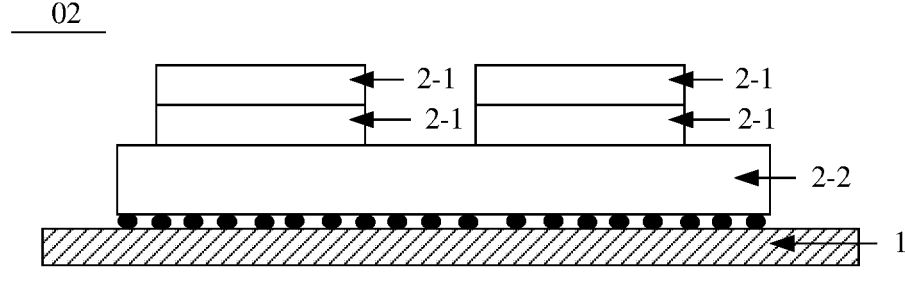
FIG. 4 is a schematic diagram of a structure of a chip stacking package according to an embodiment of this disclosure.

For example, in FIG. 3, the chips 2 may be all dies, and such a structure may be referred to as die-to-die bonding (D2D bonding). Alternatively, in FIG. 3, the chips 2 may be all chip wafers, and such a structure may be referred to as wafer-to-wafer bonding (W2 W bonding). For another example, with reference to FIG. 4, FIG. 4 is another diagram of a structure of a chip stacking package. In the chip stacking package 02, after a plurality of dies 2-1 are stacked, the plurality of dies 2-1 are carried on chip wafers 2-2, and the chip wafers 2-2 are integrated on the package substrate 1. Such a structure may be referred to as die-to-wafer bonding (D2 W bonding).

A quantity of stacked chips 2 in the chip stacking structure is not limited in this disclosure, and the quantity of stacked chips 2 may be set based on a requirement of an disclosure. In addition, the chips 2 may be a storage chip, a logical chip, or a chip with another function.

The chip stacking structure may be applied to a high bandwidth memory (High Bandwidth Memory, HBM), a dynamic random access memory (DRAM), a complementary metal oxide semiconductor (CMOS), a CMOS image sensor (CIS), a NAND flash, or the like.

The following describes the chip stacking structure in detail with reference to the accompanying drawings.

Figure 5:
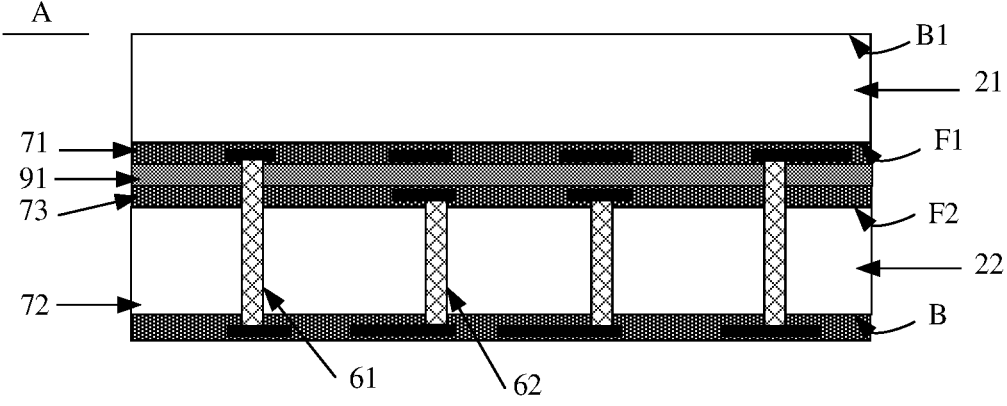
FIG. 5 is a schematic diagram of a structure of a chip stacking structure according to an embodiment of this disclosure.

FIG. 5 is a diagram of a structure of a chip stacking structure. The chip stacking structure A includes a first chip 21 and a second chip 22 that are stacked. An active surface F1 of the first chip 21 faces an active surface F2 of the second chip 22. A first redistribution layer (RDL) 71 is disposed on the active surface F1 of the first chip 21, a third redistribution layer 73 is disposed on the active surface F2 of the second chip 22, and a second redistribution layer 72 is disposed on a passive surface B of the second chip 22.

Figure 6:
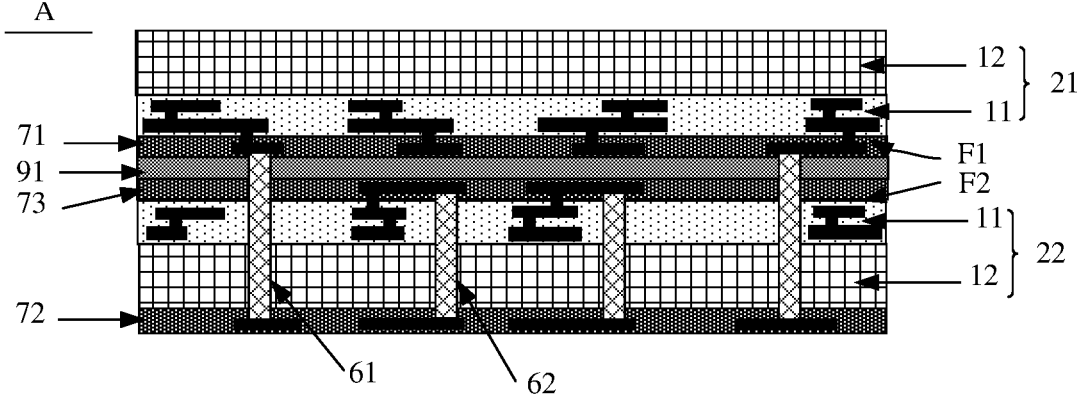
FIG. 6 is a detailed diagram of the structure in FIG. 5.

FIG. 6 is a detailed diagram of the structure in FIG. 5. Each of the first chip 21 and the second chip 22 includes a substrate 12 and an active layer 11. The active layer 11 is disposed on the substrate 12. The active layer 11 is a circuit structure for forming a chip, and electronic components such as a transistor, a diode, a resistor, a capacitor, and an inductor are disposed on the substrate 12. The active layer 11 includes a plurality of layers of metal lines located on the substrate 12, and the plurality of layers of metal lines are configured to electrically connect a plurality of electronic components, to form a circuit structure. The substrate 12 may also be made of a semiconductor material, and may be a silicon substrate, a gallium arsenide (GaAs) substrate, a gallium arsenide phosphate (GaAsP) substrate, a silicon carbide (SiC) substrate, or the like.

It should be noted that, as shown in FIG. 6, the active surface F1 of the first chip 21 or the active surface F2 of the second chip 22 is a surface of the active layer 11 away from the substrate 12, and a passive surface of the first chip 21 or the passive surface of the second chip 22 is a surface of the substrate 12 away from the active layer 11.

In addition, as shown in FIG. 5 and FIG. 6, a dielectric layer 91 is disposed between the first redistribution layer 71 and the third redistribution layer 73, and the dielectric layer 91 is used as a bonding layer in a fusion bonding process, and is configured to implement fastening between the second chip 22 and the first chip 21.

In a specific process, a dielectric layer may be first formed on each of the first redistribution layer 71 and the third redistribution layer 73, and then the fusion bonding is performed on the dielectric layers. In this way, the dielectric layers are bonded in a covalent bonding manner. In comparison with bonding of an adhesive layer, bonding strength between chips is improved, and no organic pollution is caused.

In some implementations, a material of the dielectric layer 91 may be silicon oxide. When a silicon oxide material is selected, in a fusion bonding process, bonding can be performed between the second chip 22 and the first chip 21 by using a Si—O—Si covalent bond. Because bonding energy of the silicon oxygen bond is large, bonding strength between two wafers is further improved. In addition, the silicon oxide material has high process compatibility, and silicon oxide is also a material that is commonly used in a process and has low costs. Therefore, selecting the silicon oxide material helps reduce process difficulty and process costs. In some other implementations, the dielectric layer may alternatively be an oxidized layer such as a pyridine oxide layer, a silicon nitride layer, an aluminum oxide layer, or a lanthanum oxide layer.

To implement an electrical connection between the first chip 21 and the second chip 22, with reference to FIG. 6, the chip stacking structure further includes a first conductive channel 61. The first conductive channel 61 passes through the second chip 22, the third redistribution layer 73, and the dielectric layer 91, and connects the first redistribution layer 71 on the active surface F1 of the first chip 21 and the second redistribution layer 72 on the passive surface B of the second chip 22. In this way, signal interworking between the first chip 21 and the second chip 22 can be implemented through the first conductive channel 61, the first redistribution layer 71, and the second redistribution layer 72.

In some implementations, when a material of the substrate 12 is silicon, the first conductive channel 61 may be referred to as a through silicon via (through silicon via, TSV).

To be specific, as shown in FIG. 6, signal interworking may be implemented between the first chip 21 and the second chip 22 through the first conductive channel 61, the first redistribution layer 71, and the second redistribution layer 72. For example, if the second chip 22 is a logical chip and the first chip 21 is a storage chip, a result of an operation performed by the second chip 22 may be stored in the first chip 21 through the second redistribution layer 72, the first conductive channel 61, and the first redistribution layer 71.

In addition, with reference to FIG. 5 and FIG. 6, the chip stacking structure further includes a second conductive channel 62, where the second conductive channel 62 connects the third redistribution layer 73 on the active surface of the second chip 22 and the second redistribution layer 72 on the passive surface of the second chip 72. That is, signal transmission in the second chip 22 is implemented through the second conductive channel 62, the third redistribution layer 73, and the second redistribution layer 72.

In some implementations, for example, when the second chip 22 is a logical chip and the first chip 21 is a storage chip, if a logical operation result of the second chip 22 needs to be transmitted to the first chip 21 for storage, the operation result of the second chip 22 may be transmitted to the second chip 22 through the second redistribution layer 72 and the first conductive channel 61. In addition, the operation result of the second chip 22 may also be transmitted to the second chip 22 through the third redistribution layer 73, the second conductive channel 62, the second redistribution layer 72, and the first conductive channel 61. In comparison with a data capacity in transmission through the first conductive channel 61 alone, a capacity of data transmitted in the first conductive channel can be reduced. In this way, the chip stacking structure provided in this embodiment of this disclosure can increase a bandwidth.

In some other implementations, for example, when the second chip 22 is a logical chip and the first chip 21 is a storage chip, a logical operation result of the second chip 22 may be stored in another position of the second chip 22 through the second conductive channel 62, the third redistribution layer 73, and the second redistribution layer 72. In comparison with a bandwidth of storing the operation result in the first chip 21 through the first conductive channel 61, a bandwidth of the chip stacking structure is also increased.

In conclusion, another signal transmission path is provided for the chip stacking structure through disposing the second conductive channel. In this way, the capacity of data transmitted through the first conductive channel of the chip stacking structure is reduced, and the bandwidth is correspondingly increased. That the bandwidth is increased herein may be understood as that a frequency band width occupied by a signal of the chip stacking structure is broadened.

FIG. 5 and FIG. 6 only show a chip stacking structure including the first chip 21 and the second chip 22. If a third chip, a fourth chip, or more chips are further included, the chip stacking structure may be shown in FIG. 7. The chip stacking structure in FIG. 7 includes the first chip 21, the second chip 22, and a third chip 23 that are stacked. The active surface F1 of the first chip 21 is opposite to the active surface F2 of the second chip 22, and an active surface F3 of the third chip 23 is opposite to a passive surface B2 of the second chip 22.

In addition, the active surface of the third chip 23 has a fifth redistribution layer 75, and a passive surface of the third chip 23 has a fourth redistribution layer 74; the fourth redistribution layer 74 on the passive surface of the third chip 23 and the second redistribution layer 72 on the passive surface of the second chip 22 are connected through a third conductive channel 63, and the third conductive channel 63 passes through the third chip 23 and the fifth redistribution layer 75 and a second dielectric layer 92; and the fourth redistribution layer 74 on the passive surface of the third chip 23 and the fifth redistribution layer 75 on the active surface of the third chip 23 are connected through a fourth conductive channel 64, and the fourth conductive channel 64 passes through the third chip 23.

In this way, not only signal interconnection between the third chip 23 and the second chip 22 is implemented, but also signal interworking in the third chip 23 can be implemented.

Figure 7:
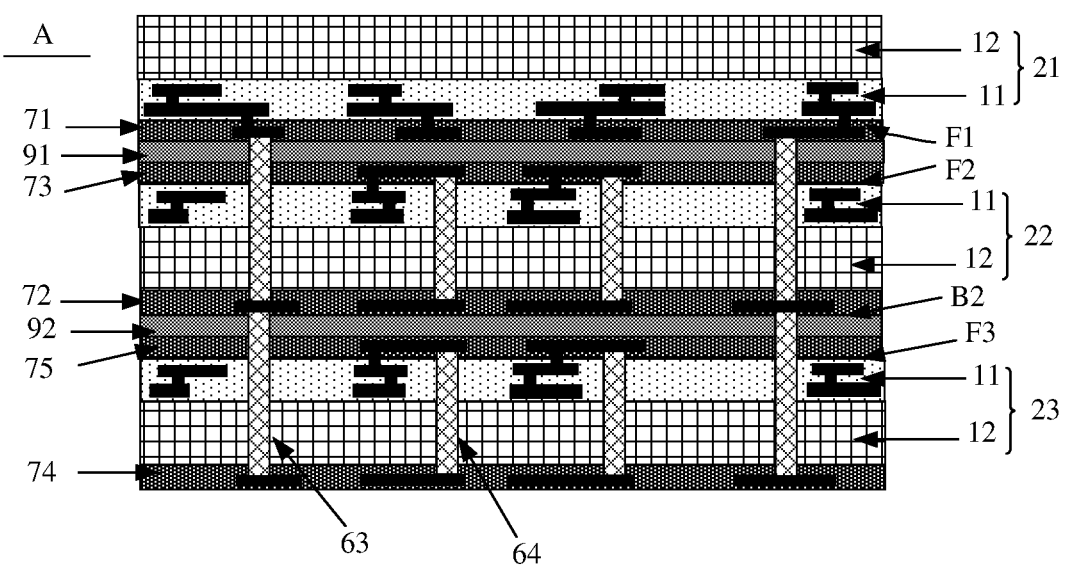
FIG. 7 is a schematic diagram of a structure of a chip stacking structure according to an embodiment of this disclosure.
Figure 8:
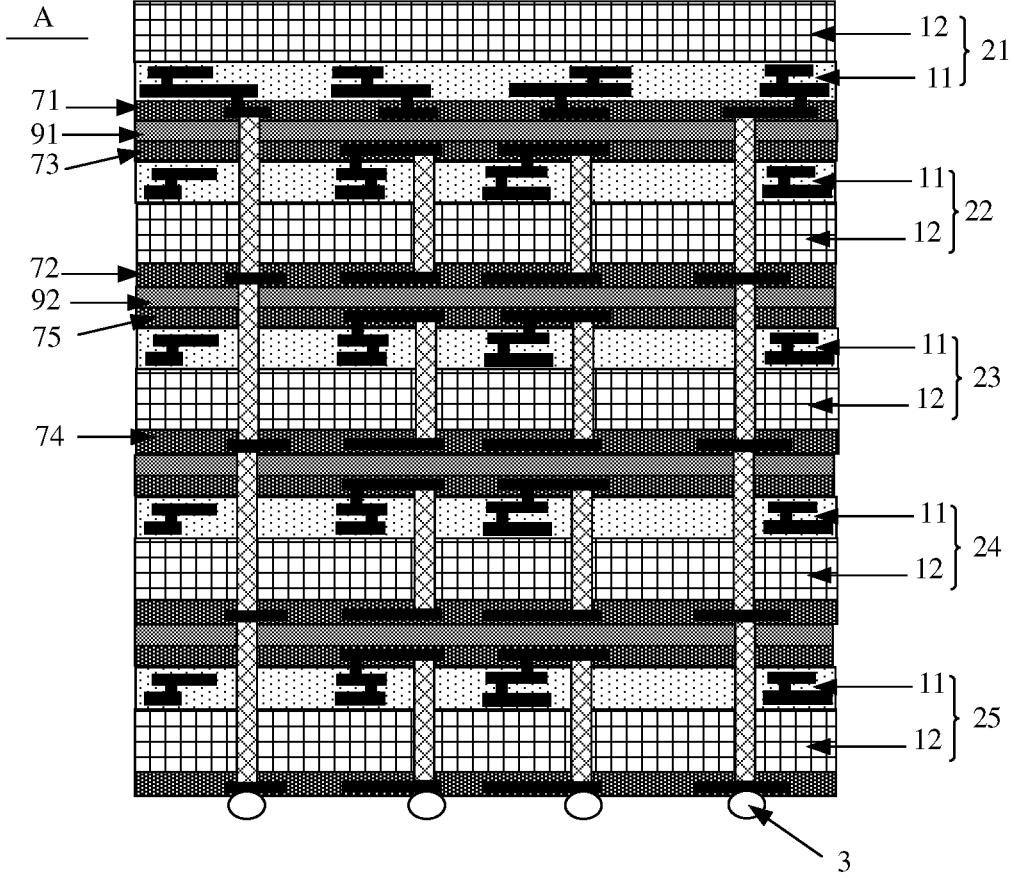
FIG. 8 is a schematic diagram of a structure of a chip stacking structure according to an embodiment of this disclosure.

If more chips are integrated on the basis of the structure shown in FIG. 7, for example, as shown in FIG. 8, the first chip 21, the second chip 22, the third chip 23, a fourth chip 24, and a fifth chip 25 that are sequentially stacked are included, in the chip stacking structure shown in FIG. 5 to FIG. 8, a stacking manner of the first chip 21 and the second chip 22 that are adjacent is active surface-to-active surface (F2F), and a stacking manner of other two adjacent chips is passive surface-to-active surface (B2F).

Figure 9:
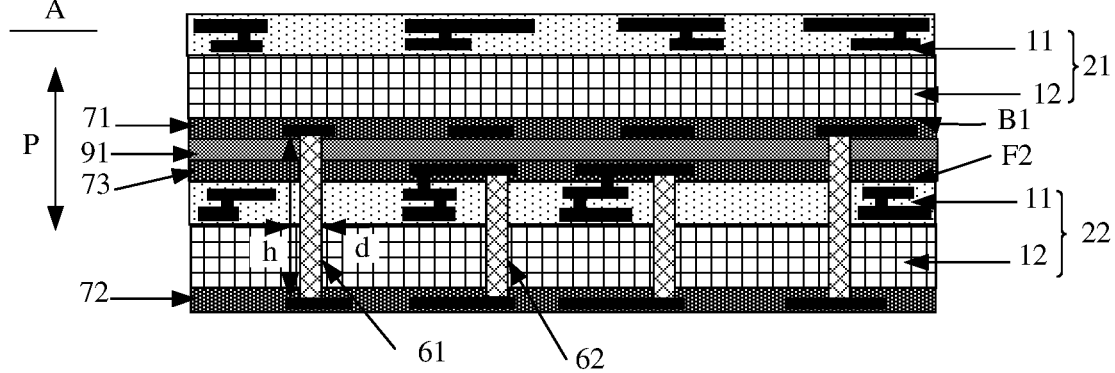
FIG. 9 is a schematic diagram of a structure of a chip stacking structure according to an embodiment of this disclosure.

FIG. 9 is a diagram of a structure of another chip stacking structure. A difference between the chip stacking structure and the chip stacking structure shown in FIG. 5 to FIG. 8 lies in that: a passive surface B1 of a first chip 21 faces an active surface F2 of a second chip 22; and the two structures are the same in that the chip stacking structure shown in FIG. 9 also has a first conductive channel 61 configured to electrically conduct the first chip 21 and the second chip 22, and has a second conductive channel 62 for implementing electrical conduction in the second chip 22.

Figure 10:
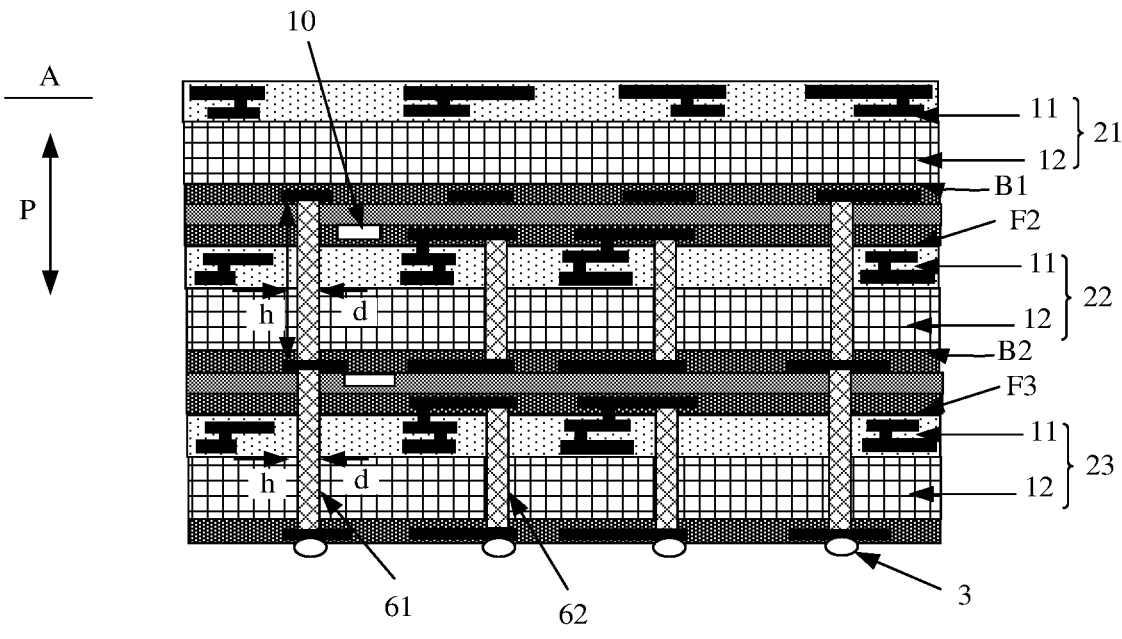
FIG. 10 is a schematic diagram of a structure of a chip stacking structure according to an embodiment of this disclosure.

FIG. 10 is a diagram of a structure of another chip stacking structure. The chip stacking structure not only includes a first chip 21 and a second chip 22, but also includes a third chip 23. Stacking manners between the first chip 21 and the second chip 22 and between the second chip 22 and the third chip 23 are both passive surface-to-active surface (B2F).

Based on the foregoing different chip stacking structures in FIG. 5 to FIG. 10, the signal transmission path is not limited to the first conductive channel, and further includes the second conductive channel. Therefore, in comparison with those in a structure with only the first conductive channel, a data capacity transmitted by the first conductive channel is reduced, and a bandwidth of the entire chip stacking structure is expanded.

In a current technology, for example, for a chip stacking structure prepared by using a D2D bonding technology or a D2 W bonding technology, each die is first obtained by cutting a chip wafer, and then impurities on each die are cleaned. However, when the chip stacking structure in embodiments of this disclosure is die-to-die stacking or die-to-chip wafer stacking, a plurality of chip wafers may be first stacked in sequence, and then the plurality of chip wafers are cut to form the chip stacking structure. In terms of a cleaning process, in this disclosure, only a plurality of chip stacking structures obtained through cutting need to be cleaned. In comparison with complexity of cleaning each die, cleaning complexity is greatly reduced.

In the current technology, in a process of stacking a plurality of dies, every two adjacent dies need to be electrically connected to each other through a μBump and a TSV. Therefore, when the plurality of dies are stacked, each μBump needs to be aligned with a corresponding TSV. An alignment operation is time-consuming. Especially as a size of each die is reduced, an alignment process is more time-consuming. For example, a chip stacking structure includes three dies. In this case, alignment needs to be performed three times. If more dies are included, a quantity of alignment times also correspondingly increases, and as a quantity of chips increases, alignment precision also increases, and time required is longer. However, when the chip stacking structure in embodiments of this disclosure is die-to-die stacking or die-to-chip wafer stacking, the plurality of chip wafers may be first stacked in sequence. In a process of aligning a chip wafer with a chip wafer, alignment between a plurality of dies and a plurality of dies can be implemented by performing only one alignment operation between a chip wafer and a chip wafer, so that production efficiency is improved and production costs are reduced.

In the current technology, before dies are stacked, to utilize dies that are known to be qualified, the dies need to be tested one by one. In this way, the production efficiency is also decreased, and the production costs are increased. However, in this disclosure, when the chip wafer and the chip wafer are stacked, a performance test of chip wafers can implement detection of a plurality of dies, so that the production efficiency is improved and the production costs are reduced.

In the chip stacking structures provided in embodiments of this disclosure, because redistribution layers connected to the first conductive channel 61 and the second conductive channel 62 are located at different positions, depths of the first conductive channel 61 and the second conductive channel 62 along a stacking direction (for example, a P direction in FIG. 10) are also different, and a depth h of the second conductive channel 62 is less than a depth h of the first conductive channel 61.

In addition, a depth-width ratio (for example, a ratio of h to d in FIG. 10) of the second conductive channel 62 may be the same as or different from a depth-width ratio of the first conductive channel 61.

A conductive material filled in the first conductive channel 61 may be the same as or different from a conductive material in the second conductive channel 62. For example, the conductive material may be a conductive material having a good conductive effect, such as copper, aluminum, or nickel.

Because copper has good conductivity, and a copper filling process is mature, in some embodiments of this disclosure, the conductive material filled in the first conductive channel 61 and the second conductive channel 62 is copper.

Before the chips are stacked, a circuit probe (CP) test needs to be performed on a previous stacked chip. As shown in FIG. 10, a CP pad 10 is disposed on a redistribution layer. In other words, the CP pad 10 is connected to another test device to test the chip.

After the plurality of chips are stacked, for example, with reference to FIG. 10, a μBump 3 may be disposed on are distribution layer on a passive surface of a chip that is away from the first chip after the stacking, or a controlled collapse chip connection solder joint may be disposed to implement connection to the package substrate through the μBump 3 or the controlled collapse chip connection solder joint.

An embodiment of this disclosure further provides preparation method of a chip stacking structure. As shown in FIG. 11, the preparation method includes the following steps.

S1: Form a first redistribution layer on a surface of a first chip facing a second chip, and form a third redistribution layer on an active surface of the second chip.

Herein, the forming a first redistribution layer on a surface of a first chip facing a second chip includes two cases. One case is forming the first redistribution layer on an active surface of the first chip, so that the active surface of the second chip is opposite to the active surface of the first chip, and a stacking structure of active surface-to-active surface (F2F) is formed; and the other case is forming the first redistribution layer on a passive surface of the first chip, so that the active surface of the second chip is opposite to the passive surface of the first chip, and a stacking structure of passive surface-to-active surface (B2F) is formed.

S2: Connect the first redistribution layer and the third redistribution layer opposite to each other.

When the first chip is connected to the second chip, a dielectric layer may be first formed on the first redistribution layer on the surface of the first chip facing the second chip, and a dielectric layer may be formed on the third redistribution layer on a surface of the second chip facing the first chip. The first chip and the second chip are fastened opposite to each other through a fusion bonding process between the dielectric layers. The fusion bonding process is simple and mature, so that production costs are reduced. In comparison with other stacking manners such as hybrid bonding and temporary bonding, no other intermediate layer needs to be introduced, so that pollution to the first chip and the second chip is avoided.

Before a subsequent process is performed, a passive surface of the second chip may be thinned to a required thickness, for example, through physical grinding, chemical mechanical polishing, or chemical mechanical polishing and wet etching. It is clear that another thinning process may also be used.

S3: Form a first conductive channel and a second conductive channel, so that the first conductive channel passes through the second chip and the third redistribution layer, and the second conductive channel passes through the second chip.

When the first conductive channel and the second conductive channel are formed, drilling may be performed first. For example, the drilling may be performed in a manner of dry etching or laser drilling. Then, a hole is filled with a conductive material, such as copper.

When copper is filled in the hole, metal filling of a TSV may be completed in a manner of chemical vapor deposition, sputtering deposition, ion beam deposition, physical vapor deposition, atomic layer deposition, molecular beam epitaxial vapor deposition, and electroplating.

For example, an insulation layer may be first formed on a wall surface of the hole, then a barrier layer is formed on the insulation layer, then a copper seed layer is formed on the barrier layer, and finally the metal copper is filled in the hole.

The barrier layer can prevent copper ions from spreading and affecting conductivity. When electroplating the metal copper, the copper seed layer enables electroplated metal copper to be better covered in the hole, to improve conductivity reliability of the conductive channel.

When forming the second conductive channel and the first conductive channel, the second conductive channel and the first conductive channel may be prepared at the same time, or the first conductive channel may be prepared before the second conductive channel, or the second conductive channel may be prepared before the first conductive channel.

It is clear that to simplify a preparation process, the first conductive channel and the second conductive channel may be formed at the same time. For example, a first hole and a second hole are first provided, so that one end of the first hole passes through to the first redistribution layer of the first chip facing the second chip, and one end of the second hole passes through to the third redistribution layer of the second chip facing the first chip. Then, both the first hole and the second hole are filled with conductive materials, so that the first hole filled with the conductive material forms the first conductive channel, and the second hole filled with the conductive material forms the second conductive channel.

S4: Form a second redistribution layer on the passive surface of the second chip, so that the first redistribution layer and the second redistribution layer are connected through the first conductive channel, and the second redistribution layer and the third redistribution layer are connected through the second conductive channel.

It should be noted that the chips in the foregoing preparation method may be dies, or may be chip wafers. The die and the chip wafer herein are the same as the foregoing explanations.

The chip stacking structure obtained according to the foregoing preparation method not only includes the first conductive channel configured to implement an electrical connection between the first chip and the second chip, but also includes the second conductive channel configured to implement an electrical connection in the second chip. In this way, a signal transmission path of the chip stacking structure is added, and a bandwidth is further increased.

After the first chip and the second chip are stacked, to ensure working performance of each chip, a CP test further needs to be performed on the chips. For example, a performance test is performed on the chip through a CP pad disposed on the second redistribution layer on the passive surface of the second chip.

After the first chip and the second chip are stacked, if a third chip further needs to be stacked, the following preparation method may be performed.

A fifth redistribution layer is formed on an active surface of the third chip.

After the second redistribution layer is formed on the passive surface of the second chip, the active surface of the third chip is opposed and connected to the passive surface of the second chip.

A third conductive channel and a fourth conductive channel are formed. Similarly, the third conductive channel and the fourth conductive channel herein may be formed at the same time, or may be formed in sequence. The third conductive channel passes through the third chip and the fifth redistribution layer, and the fourth conductive channel passes through the third chip.

A fourth redistribution layer is formed on a passive surface of the third chip, so that the fourth redistribution layer and the second redistribution layer are connected through the third conductive channel, and the fifth redistribution layer and the fourth redistribution layer are connected through the fourth conductive channel.

Similarly, when the third chip and the second chip are fastened opposite to each other, the two chips are also connected through a fusion bonding process between dielectric layers.

If more chips need to be stacked, a manner of stacking the third chip on the second chip is used.

FIGS. 12A-12K show a preparation method of a chip stacking structure, including stacking three chips. The method can implement signal interconnection between chips and signal interconnection inside a chip.

Figures 12A, 12B, 12C, 12D, 12E:
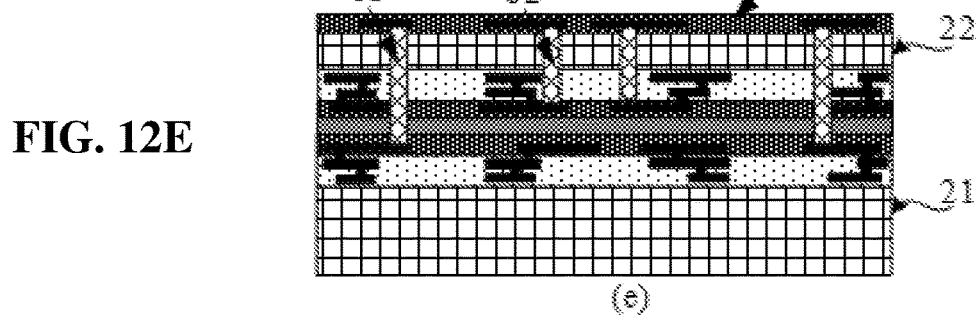
FIGS. 12A-12K are corresponding schematic diagrams of a structure of a chip stacking structure after each step of preparing the chip stacking structure is completed according to an embodiment of this disclosure.

As shown in (a) in FIG. 12A, a first redistribution layer 71 is formed on an active surface of a first chip 21, a third redistribution layer 73 is formed on an active surface of a second chip 22, and a dielectric layer 91 is formed on each of the first redistribution layer 71 and the third redistribution layer 73.

As shown in (b) in FIG. 12B, the second chip 22 is turned over, and bonding is performed between the dielectric layers 91 through fusion bonding, so that the first chip 21 and the second chip 22 are connected.

As shown in (c) in FIG. 12C, a passive surface B2 of the second chip is thinned to a required thickness, for example, the second chip is thinned to be less than or equal to 100 μm.

As shown in (d) in FIG. 12D, a first conductive channel 61 and a second conductive channel 62 are formed, so that one end of the first conductive channel 61 is connected to the first redistribution layer 71 on the active surface of the first chip, and one end of the second conductive channel 62 is connected to the third redistribution layer 73 on the active surface of the second chip 22.

As shown in (e) in FIG. 12E, a second redistribution layer 72 is formed on a passive surface of the second chip 22, so that the other end of the first conductive channel 61 is connected to the second redistribution layer 72, and the other end of the second conductive channel 62 is connected to the second redistribution layer 72. Then a CP test is performed.

Figures 12F, 12G, 12H:

As shown in (f) in FIG. 12F, a fifth redistribution layer 75 is formed on an active surface F of a third chip 23, a dielectric layer is formed on the fifth redistribution layer 75, and a dielectric layer is formed on the second redistribution layer 72 of the second chip 22.

As shown in (g) in FIG. 12G, the third chip 23 is turned over, and the third chip 23 and the second chip 22 are connected through fusion bonding between dielectric layers. In addition, thinning processing is performed on a passive surface of the third chip 23.

As shown in (h) in FIG. 12H, a third conductive channel 63 and a fourth conductive channel 64 are formed, so that one end of the third conductive channel 63 is connected to the second redistribution layer 72 on the passive surface of the second chip 22, and one end of the fourth conductive channel 64 is connected to the fifth redistribution layer 75 on the active surface of the third chip 23.

Figures 12I, 12J, 12K:
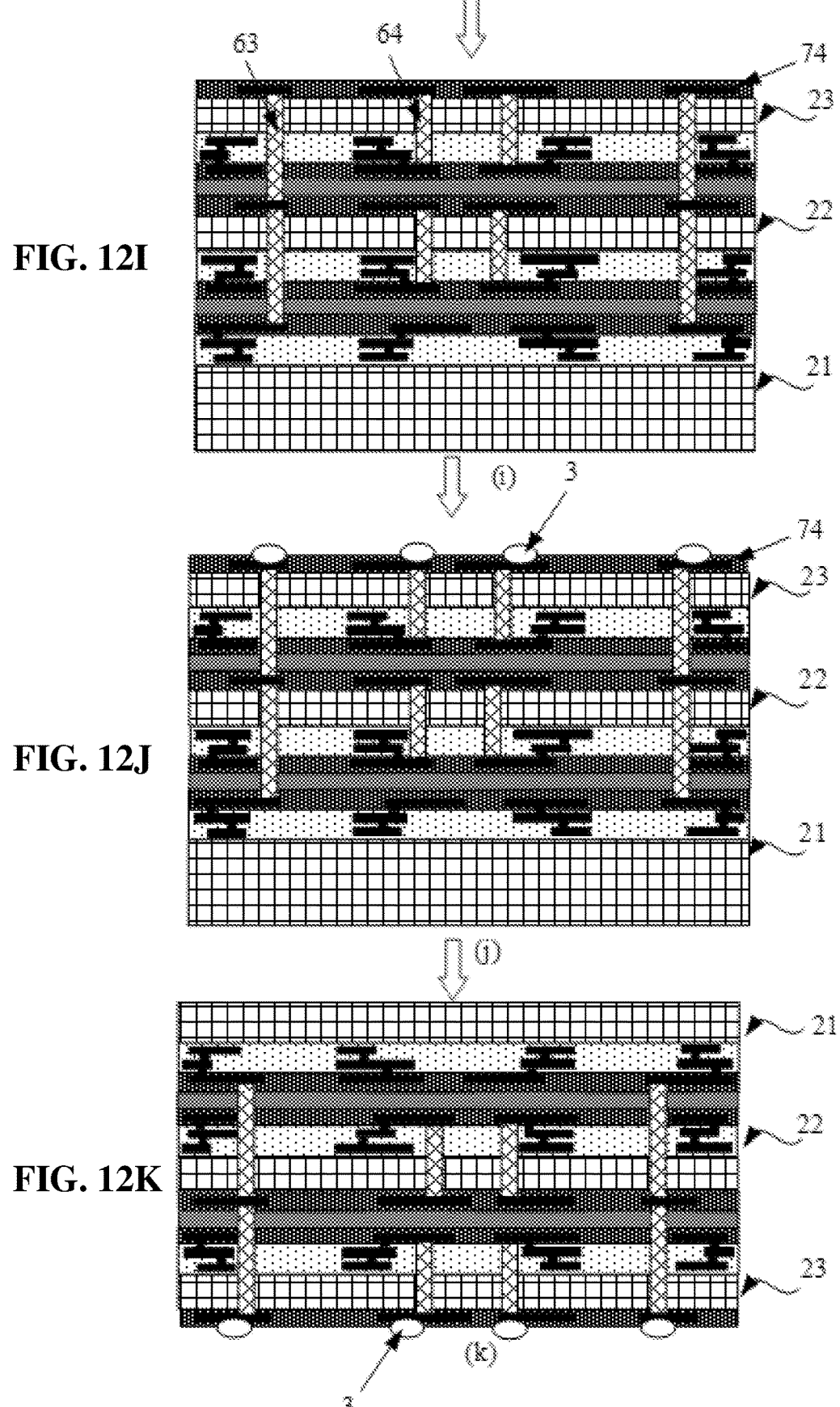

As shown in (i) in FIG. 12I, a fourth redistribution layer 74 is formed on the passive surface of the third chip 23, so that the other end of the third conductive channel 63 is connected to the fourth redistribution layer 74, and the other end of the fourth conductive channel 64 is connected to the fourth redistribution layer 74. Then the CP test is performed.

As shown in (j) in FIG. 12J, a micro bump 3 is disposed, and the micro bump 3 is connected to the fourth redistribution layer 74.

As shown in (k) of FIG. 12K, the first chip 21, second chip 22, and third chip 22 that are stacked are turned over, and then the passive surface of the first chip 21 is thinned to obtain a chip stacking structure in which three chips are stacked.

Based on the method of stacking the third chip on the second chip, more chips may be stacked.

When a chip stacking structure is prepared by using this method, the first chip and the second chip are stacked in a manner of active surface-to-active surface, and no carrier wafer is used, so that a process flow is simplified, problems such as organic pollution and wafer warping in a process are effectively avoided, and process reliability is ensured.

FIGS. 13A-13H show another preparation method of a chip stacking structure, including stacking two chips. The method can implement signal interconnection between chips and signal interconnection in a chip.

Figures 13A, 13B, 13C, 13D, 13E:
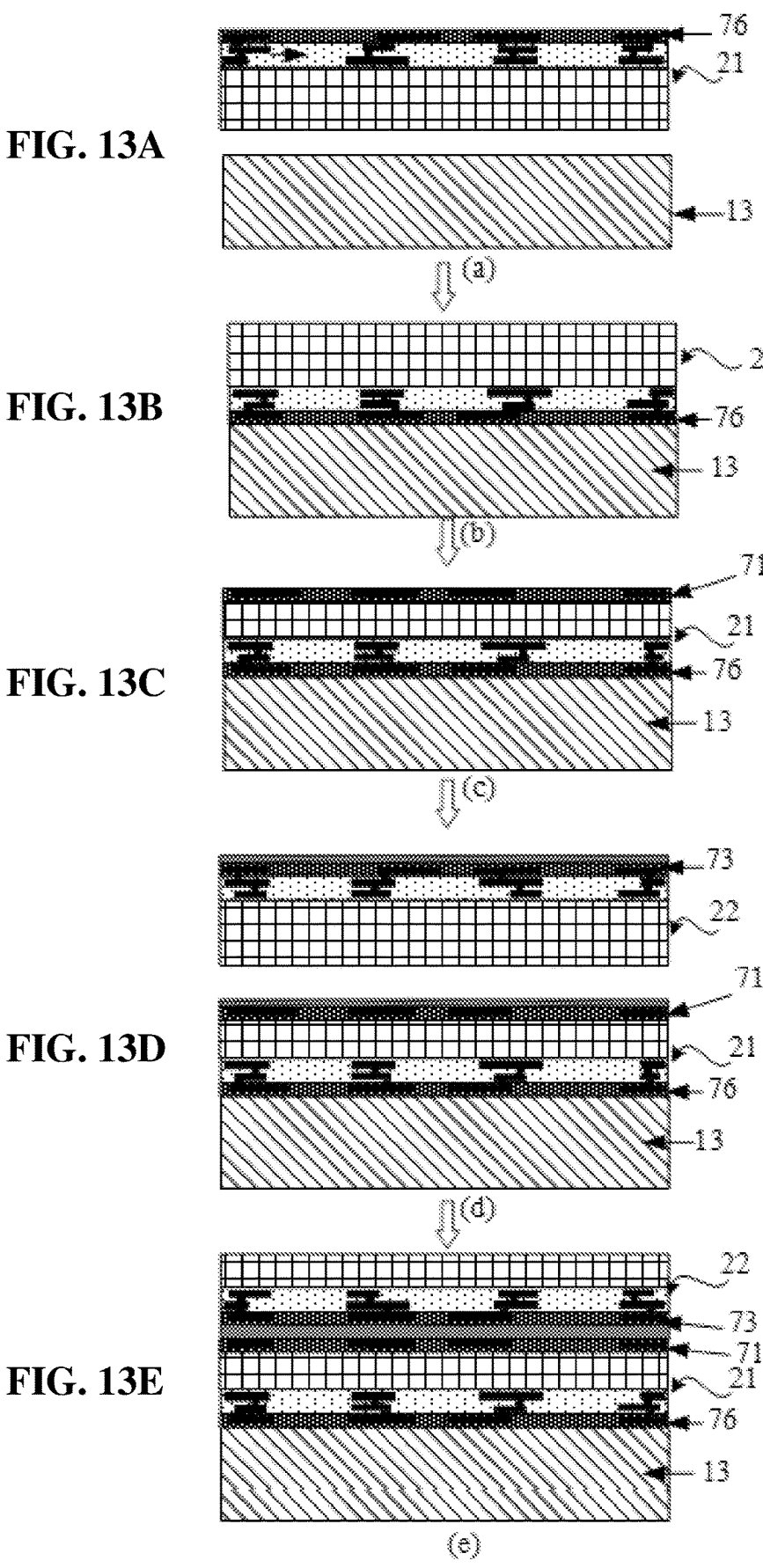
FIGS. 13A-13H are corresponding schematic diagrams of a structure of a chip stacking structure after each step of preparing the chip stacking structure is completed according to an embodiment of this disclosure.

As shown in (a) in FIG. 13A, a sixth redistribution layer 76 is formed on an active surface of a first chip 21.

As shown in (b) in FIG. 13B, the first chip 21 is turned over and carried on a carrier 13, and the active surface of the first chip 21 faces the carrier 13. The carrier 13 herein may be a wafer, or may be a substrate.

As shown in (c) in FIG. 13C, a passive surface of the first chip 21 is thinned to a required thickness, and a first redistribution layer 71 is formed on the passive surface of the first chip 21.

As shown in (d) in FIG. 13D, a third redistribution layer 73 is formed on an active surface of a second chip 22, a dielectric layer is formed on the third redistribution layer 73, and a dielectric layer is formed on the first redistribution layer 71 on the passive surface of the first chip 21.

As shown in (e) in FIG. 13E, the second chip 22 is turned over, and the second chip 22 is stacked on the first chip 21 through the fusion bonding process between the dielectric layers. Then, a passive surface of the second chip 22 is thinned.

Figures 13F, 13G, 13H:
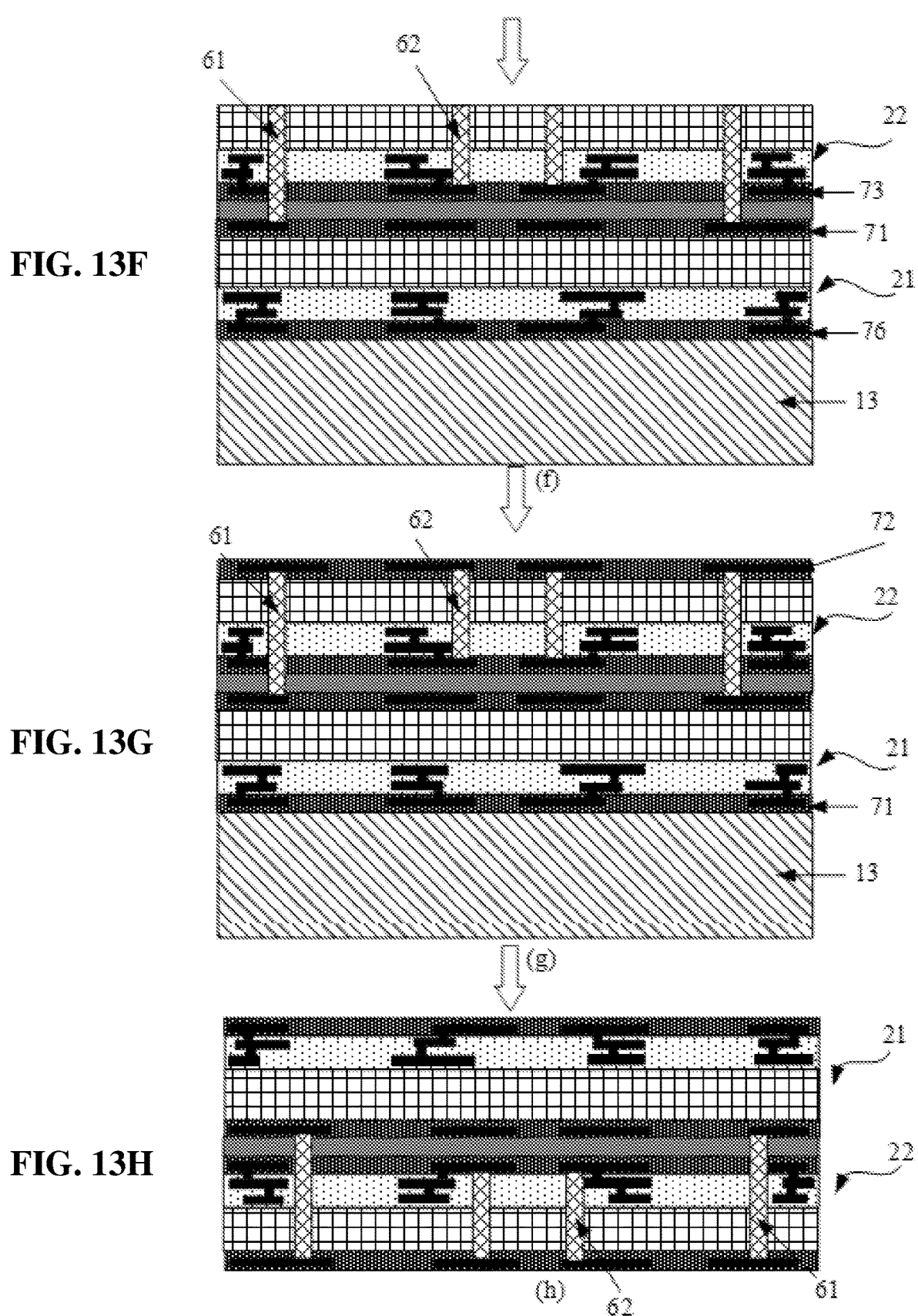

As shown in (f) in FIG. 13F, a first conductive channel 61 and a second conductive channel 62 are formed, so that one end of the first conductive channel 61 is connected to the first redistribution layer 71 on the passive surface of the first chip 21, and one end of the second conductive channel 62 is connected to the third redistribution layer 73 on the active surface of the second chip 22.

As shown in (g) in FIG. 13G, the second redistribution layer 72 is formed on the passive surface of the second chip 22, so that the other end of the first conductive channel 61 is connected to the second redistribution layer 72, and the other end of the second conductive channel 62 is connected to the second redistribution layer 72. Then the CP test is performed.

As shown in (h) in FIG. 13H, the carrier 13, the first chip 21, and the second chip 22 that are stacked are turned over, and the carrier 13 is removed. In this way, a chip stacking structure in which two chips are stacked is obtained.

Based on the method of stacking the second chip on the first chip, more chips may be stacked.

When a chip stacking structure is prepared by using this method, a stacking manner of the second chip and the first chip is active surface-to-passive surface. In this way, a mirror effect of pattern layers between chips is avoided, and process complexity is reduced.

In addition, in (c) in FIG. 13C, a fifth conductive channel may also be formed in the first chip 21, so that the fifth conductive channel is connected to the first redistribution layer 71 and the sixth redistribution layer 76. In this way, signal interworking in the first chip may be implemented through the fifth conductive channel.

In the descriptions of this specification, specific features, structures, materials, or characteristics may be combined in a proper manner in any one or more of embodiments or examples.

The foregoing descriptions are merely specific implementations of this disclosure, but are not intended to limit the protection scope of this disclosure. Any variation or replacement readily figured out by a person skilled in the art within the technical scope disclosed in this disclosure shall fall within the protection scope of this disclosure. Therefore, the protection scope of this disclosure shall be subject to the protection scope of the claims.

What is claimed is:

1. A chip stacking structure comprising:
   a first chip;
   a second chip stacked with the first chip, wherein a second active surface of the second chip faces a first active surface of the first chip, or the second active surface of the second chip faces a passive surface of the first chip;
   a first redistribution layer disposed on a surface of the first chip facing the second chip;
   a second redistribution layer disposed on a passive surface of the second chip;
   a third redistribution layer disposed on the second active surface of the second chip;
   a first conductive channel passing through the second chip and the third redistribution layer, and connecting the first redistribution layer and the second redistribution layer; and
   a second conductive channel passing through the second chip, and connecting the second redistribution layer and the third redistribution layer.

2. The chip stacking structure according to claim 1, further comprising:
   a third chip stacked on the passive surface of the second chip, wherein a third active surface of the third chip faces the passive surface of the second chip;
   a fourth redistribution layer disposed on a passive surface of the third chip;

a fifth redistribution layer disposed on the third active surface of the third chip;
   a third conductive channel passing through the third chip and the fifth redistribution layer, and connecting the fourth redistribution layer and the second redistribution layer; and
   a fourth conductive channel passing through the third chip, and connecting the fourth redistribution layer and the fifth redistribution layer.

3. The chip stacking structure according to claim 1, wherein the second active surface of the second chip faces the passive surface of the first chip, and the first redistribution layer is disposed on the passive surface of the first chip; and
   the chip stacking structure further comprises:
   an another redistribution layer disposed on the first active surface of the first chip; and an another conductive channel passing through the first chip, and connecting the another redistribution layer and the first redistribution layer.

4. The chip stacking structure according to claim 1, wherein along a stacking direction, a depth of the first conductive channel is greater than a depth of the second conductive channel.

5. The chip stacking structure according to claim 1, wherein a conductive material in the first conductive channel is the same as a conductive material in the second conductive channel.

6. The chip stacking structure according to claim 1, further comprising:
   a dielectric layer formed between the first redistribution layer and the third redistribution layer.

7. The chip stacking structure according to claim 6, wherein the dielectric layer is configured to be a bonding layer in a fusion bonding process, and is configured to fasten the first chip and the second chip.

8. The chip stacking structure according to claim 6, wherein a material of the dielectric layer comprises silicon dioxide.

9. The chip stacking structure according to claim 1, wherein the chip stacking structure comprises N chips that are sequentially stacked, wherein N is a positive integer greater than or equal to 2, the first chip is one of outermost chips in the N chips, and a micro bump is disposed on an outer side of another outermost chip in the N chips.

10. A chip stacking package comprising:
   a package substrate; and
   the chip stacking structure according to claim 1, wherein:
   the chip stacking structure is disposed on a surface of the package substrate, and
   the second chip is closer to the package substrate than the first chip.

11. An electronic device comprising:
   a printed circuit board; and
   the chip stacking package according to claim 10, wherein the printed circuit board is electrically connected to the chip stacking package.

12. The chip stacking structure according to claim 1, wherein the second chip is a logical chip and the first chip is a storage chip, a result of an operation performed by the second chip is configured to be stored in the first chip through the second redistribution layer, the first conductive channel, and the first redistribution layer.

13. A preparation method of a chip stacking structure comprising:

forming a first redistribution layer on a surface of a first chip facing a second chip, and forming a third redistribution layer on a second active surface of the second chip;

connecting the first redistribution layer and the third redistribution layer opposite to each other;

forming a first conductive channel and a second conductive channel, so that the first conductive channel passes through the second chip and the third redistribution layer, and the second conductive channel passes through the second chip; and forming a second redistribution layer on a passive surface of the second chip, so that the first redistribution layer and the second redistribution layer are connected through the first conductive channel, and the second redistribution layer and the third redistribution layer are connected through the second conductive channel.

14. The preparation method of the chip stacking structure according to claim 13, wherein when forming the first redistribution layer on the surface of the first chip facing the second chip, the preparation method comprises:

forming the first redistribution layer on a first active surface of the first chip, so that the second active surface of the second chip is opposite to the first active surface of the first chip; or forming the first redistribution layer on a passive surface of the first chip, so that the second active surface of the second chip is opposite to the passive surface of the first chip.

15. The preparation method of the chip stacking structure according to claim 13, wherein the preparation method further comprises:

forming a fifth redistribution layer on a third active surface of a third chip; and after the forming a second redistribution layer on a passive surface of the second chip, the preparation method further comprises:

connecting the second redistribution layer and the fifth redistribution layer opposite to each other;

forming a third conductive channel and a fourth conductive channel, so that the third conductive channel passes through the third chip and the fifth redistribution layer, and the fourth conductive channel passes through the third chip; and forming a fourth redistribution layer on a passive surface of the third chip, so that the fourth redistribution layer and the second redistribution layer are connected through the third conductive channel, and the fifth redistribution layer and the fourth redistribution layer are connected through the fourth conductive channel.

16. The preparation method of the chip stacking structure according to claim 13, wherein the second conductive channel is formed at the same time when the first conductive channel is formed.

17. The preparation method of the chip stacking structure according to claim 13, wherein when connecting the first redistribution layer and the third redistribution layer opposite to each other, the preparation method comprises:

forming a dielectric layer on each of the first redistribution layer and the third redistribution layer, and connecting the first chip and the second chip through fusion bonding between the dielectric layers.

18. The preparation method of the chip stacking structure according to claim 13, wherein before the connecting the first redistribution layer and the third redistribution layer opposite to each other, the preparation method further comprises:

carrying the first chip on a carrier, so that the first active surface of the first chip faces the carrier; and after the second chip is stacked on the first chip, the method further comprises:

removing the carrier.

19. The preparation method of the chip stacking structure according to claim 18, wherein the carrier is a wafer or a substrate.

20. The preparation method of the chip stacking structure according to claim 13, wherein the second chip is a logical chip and the first chip is a storage chip.

* * * * *